United States Patent [19]

Lytle et al.

[11] Patent Number: 5,674,780
[45] Date of Patent: Oct. 7, 1997

[54] METHOD OF FORMING AN ELECTRICALLY CONDUCTIVE POLYMER BUMP OVER AN ALUMINUM ELECTRODE

[75] Inventors: William H. Lytle; Treliant Fang; Jong-Kai Lin, all of Chandler; Ravinder K. Sharma, Mesa; Naresh C. Saha, Chandler, all of Ariz.

[73] Assignee: Motorola, Inc., Schaumburg, Ill.

[21] Appl. No.: 505,936

[22] Filed: Jul. 24, 1995

[51] Int. Cl.$^6$ ............................................. H01L 21/283
[52] U.S. Cl. ................... 437/183; 437/194; 437/197; 437/228
[58] Field of Search ...................... 437/183, 189, 437/194, 197, 228 ST

[56] References Cited

U.S. PATENT DOCUMENTS

| | | | |
|---|---|---|---|
| 5,055,356 | 10/1991 | Minowa et al. | 428/409 |
| 5,074,947 | 12/1991 | Estes et al. | 156/307.3 |
| 5,130,052 | 7/1992 | Kreh et al. | 252/387 |
| 5,196,371 | 3/1993 | Kulesza et al. | 437/183 |
| 5,565,378 | 10/1996 | Harada et al. | 437/182 |
| 5,583,073 | 12/1996 | Lin et al. | 437/183 |

*Primary Examiner*—T. N. Quach
*Attorney, Agent, or Firm*—George C. Chen

[57] ABSTRACT

A method of forming an electrically conductive polymer bump (22) over an aluminum electrode (21) produces low contact resistance for an interconnect structure (24). Aluminum oxide is first removed from the aluminum electrode (21). Tiron and palladium are subsequently bonded to the fresh surface of the aluminum electrode (21). Finally, the electrically conductive polymer bump (22) is formed over the aluminum electrode (21). The Tiron and palladium improve the electrical contact between the conductive polymer bump (22) and the aluminum electrode (21) thereby reducing the contact resistance. The Tiron also inhibits corrosion of the aluminum electrode (21) and enhances the conductivity by catalytically shrinking the cyanate ester conductive bump.

20 Claims, 1 Drawing Sheet

5,674,780

METHOD OF FORMING AN ELECTRICALLY CONDUCTIVE POLYMER BUMP OVER AN ALUMINUM ELECTRODE

BACKGROUND OF THE INVENTION

This invention relates, in general, to a method of fabricating interconnects, and more particularly, to a method of forming a conductive polymer bump over an aluminum electrode.

As known in the art, interconnect technology provides economical and performance advantages over conventional wiring bonding technologies. Furthermore, the use of electrically conductive polymers to form interconnects is a cost effective and high throughput process compared to other interconnect technologies such as those comprising chromium/copper/gold, titanium-tungsten/gold, or solder. For example, the other flip chip technologies require masking and etching steps while electrically conductive polymer bumps are easily printed.

The electrically conductive polymer interconnects are formed on integrated circuit bonding pads which have an exposed top surface typically comprising either aluminum or gold. However, electrically conductive polymer interconnect structures typically exhibit a detrimentally high contact resistance when formed directly on aluminum bonding pads. Moreover, portions of aluminum bonding pads which are not covered by flip chip bumps often corrode. On the other hand, gold bonding pads in conjunction with polymer interconnects exhibit a desirably low contact resistance on the order of less than 10 mΩ on 100 μm diameter bond pads and are less susceptible to corrosion compared to aluminum bonding pads. However, gold bonding pads are a much more expensive option, and therefore, aluminum bonding pads are still preferred when considering cost factors.

Accordingly, a need exists for a method of forming an electrically conductive polymer flip chip bump on an aluminum bonding pad without creating high contact resistance. The method should be cost effective, should not increase the cycle time of the process, and should not cause corrosion of the aluminum bonding pad.

DETAILED DESCRIPTION OF THE DRAWINGS

Figure 1:
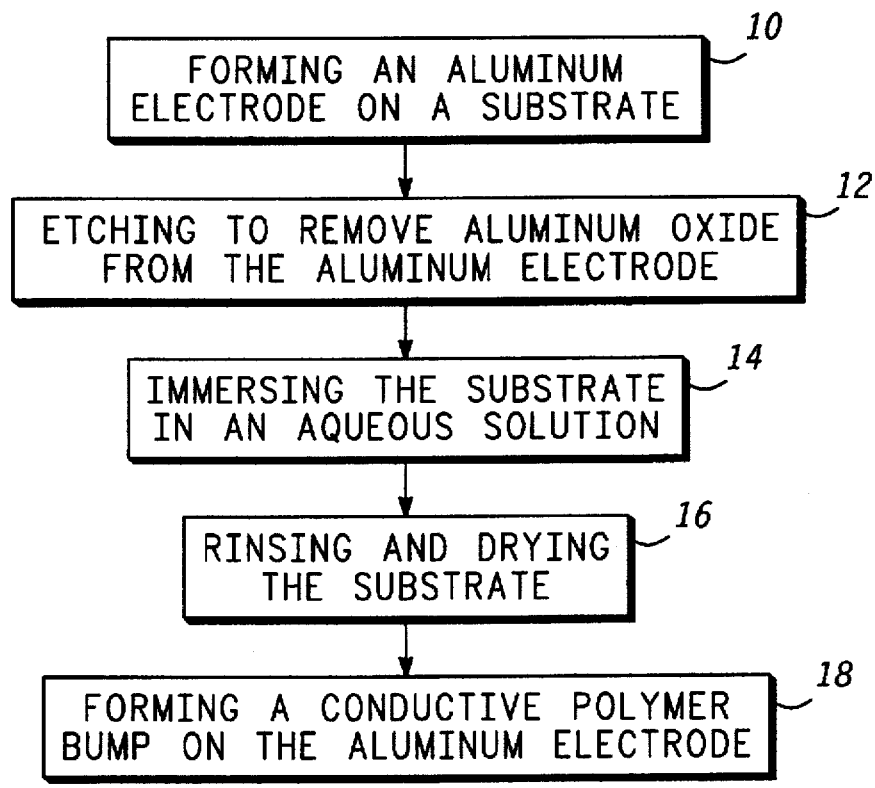
FIG. 1 outlines the process steps for a method of forming an electrically conductive polymer bump on an aluminum electrode, in accordance with the present invention.
Figure 2:
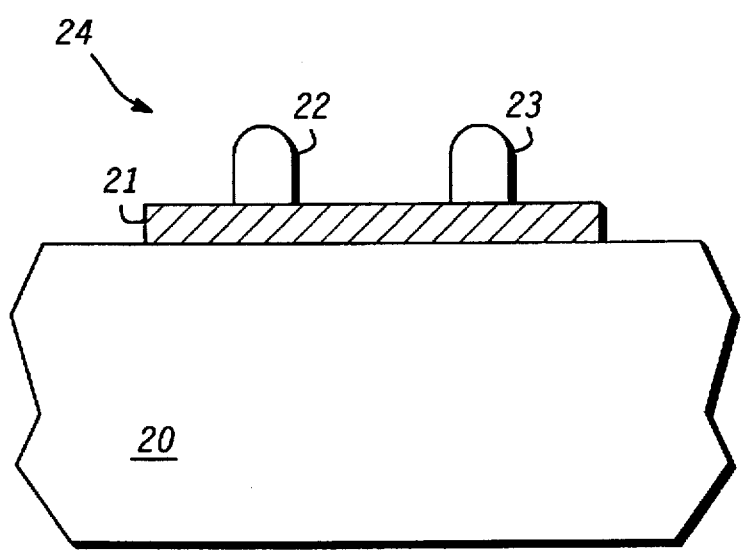
FIG. 2 illustrates a partial side view of electrically conductive polymer bumps on an aluminum electrode.

Turning to FIG. 1 for a detailed explanation of the present invention, FIG. 1 outlines the process steps for a method of forming an electrically conductive polymer bump on an aluminum bonding pad. FIG. 2 illustrates a partial side view of the resulting flip chip structure 24 after completing the process steps of FIG. 1. The method of the subject invention begins with forming an aluminum pad, aluminum electrode, or aluminum layer 21 on substrate 20 as indicated by step 10 of FIG. 1 and as depicted in FIG. 2. While substrate 20 can comprise insulating materials including printed wiring boards, organic substrates, inorganic substrates, and the like, substrate 20 can also comprise semiconducting materials including, but not limited to, silicon, silicon germanium, gallium arsenide, and indium phosphide. When substrate 20 is a semiconductor, semiconductor substrate 20 contains semiconductor devices and interconnect lines (not shown in FIG. 2) previously formed in and on semiconductor substrate 20 by conventional processing techniques. While the following description illustrates a method of forming flip chip bumps, electrically conductive polymer bumps, interconnect bumps, or conductive bumps 22 and 23 on aluminum electrode 21 of a semiconductor substrate, it is understood that the method can also be applied to other types of substrates, including insulating substrates, as well.

Forming aluminum electrode 21 is accomplished using conventional processing techniques such as the following: disposing, depositing, or sputtering aluminum to form an aluminum layer over a first surface of semiconductor substrate 20, dispensing and spinning a photoresist coating over the aluminum layer, developing a pattern in the photoresist to expose portions of the aluminum layer, etching the exposed portions of the aluminum layer, and removing the photoresist. Patterning the aluminum layer forms aluminum electrode 21 which is provided on semiconductor substrate 20 and is electrically coupled to the semiconductor devices in and on semiconductor substrate 20.

During sputtering of the aluminum layer, copper can be co-sputtered along with aluminum. Inclusion of a small amount of copper in the aluminum layer reduces electromigration effects of aluminum. Generally, less than five percent of the aluminum layer comprises copper. During sputtering of the aluminum layer, silicon can also be deposited along with aluminum and copper to prevent junction spiking of the aluminum electrode with a silicon substrate. Generally, less than three percent of the aluminum layer comprises silicon.

Upon completion of step 10 in FIG. 1, the exposed surface of the aluminum layer is covered with an aluminum oxide approximately 60 Å thick as a result of the reactive nature of aluminum and its exposure to the aluminum etch plasma and the photoresist removal process. This aluminum oxide insulates the aluminum layer and produces high contact resistance between the aluminum electrode 21 and the subsequently formed conductive polymer bumps 22 and 23 of FIG. 2. As indicated by step 12 of FIG. 1, the aluminum oxide is etched off of the aluminum electrode with an etchant. A wet etch comprising, but not limited to, alkali metal hydroxides, hydrofluoric acid, phosphoric acid, and other non-oxidizing acids having a pKa (the negative of the log of the acid dissociation constant) less than 5, removes or etches off the aluminum oxide. However, a native aluminum oxide or native oxide of approximately 30 Å will immediately form on the fresh surface of the aluminum layer upon exposure to air, water, or other medium containing hydroxide ions or oxygen. Therefore, prior to such exposure, the aluminum layer should be passivated to prevent oxidation.

The passivation process is represented by step 14 of FIG. 1 where substrate 20, and thus aluminum electrode 21, is immersed in aqueous solutions. In order to prevent oxidation of the aluminum surface after step 12, substrate 20 should be taken from the wet etch described above in step 12 and immediately dipped into the aqueous solutions of step 14 without exposure to air or water since subjecting the fresh aluminum surface to air or water forms the native oxide.

To prevent the reformation of native oxide on the surface of aluminum electrode 21 after step 14, the aqueous solution should contain a chemical which will form very stable complexes with aluminum and which has a higher formation constant than that of aluminum hydroxide which causes native oxide on aluminum. Since the log of the formation constant or log $K_1$ of aluminum hydroxide is approximately 9.27, the log $K_1$ of the chemical in the aqueous solution should be higher than 9.27. However, to ensure significant protection of aluminum electrode 21 after step 14, the formation constant of the complexing agent with aluminum should be as large as possible. Having a large formation constant will enable the complexing agents to remain bonded to aluminum electrode 21 and inhibit aluminum oxide formation when aluminum electrode 21 is exposed to air or water. An organic complexation agent or, more specifically, a chelate known as Tiron (4,5-dihydroxy-1,3-benzene disulfonic acid disodium salt) has a log $K_1$ of approximately 19 and is the preferred embodiment of the present invention. Alternative embodiments such as 5-sulfosalicylic acid, salicylic acid, or pyrocatechol-3,5-sulfonic acid instead of Tiron chelation may also be used. These chemicals may be alternatively or additionally incorporated into etches, rinses, and other types of process steps.

As described above, the thin organic layer of Tiron over aluminum electrode 21 is formed by exposure of aluminum electrode 21 to the chelation agent in an alkaline condition, or more specifically to the alkaline aqueous Tiron solution. The thin organic layer of Tiron is on the order of a single to a few monolayers thick and may not uniformly cover aluminum electrode 21. However, even if the layer of Tiron is not uniform, the Tiron layer will still prevent corrosion of aluminum electrode 21 by passivating aluminum electrode 21.

The exposure of aluminum electrode 21 to an additional aqueous solution of step 14 reduces the contact resistance of interconnect structure 24 in accordance with the present invention. The second aqueous solution, which is preferably an acidic aqueous solution, contains metallic ions such as silver, copper, zinc, tin, gold, and iridium contained in metallic salts or other metallic ions with an electromotive force or reduction potential greater than approximately −0.77 volts, but preferably palladium. Exposing the aluminum layer to an aqueous solution of palladium salts, which is preferably acidic, deposits a layer of dendritic or other crystalline forms of palladium on aluminum electrode 21. A continuous nucleation of palladium over the entire surface of aluminum electrode 21 is not required since the described treatment above produces interconnect resistances on the order of tens of milliohms for typical 100 µm diameter aluminum electrodes.

It is important to note that the order of the Tiron immersion and the palladium immersion may be reversed from the above description. In other words, the method of the subject invention can be performed with the palladium immersion prior to the Tiron immersion. As an additional alternative embodiment, the immersion step in the aqueous Tiron solution, which preferably alkaline, may also be left out of the process under the scope of the present invention. However, in doing so, the contact resistance of flip chip structure 24 may not be as low as when the Tiron immersion is used. It is also important to note that the aqueous solutions can be buffered with stabilizing agents and the like.

Subsequent to the aqueous solution immersions of step 14, substrate 20 and aluminum electrode 21 are rinsed, preferably with deionized water, and then dried or blow dried, preferably with an inert gas such as nitrogen or argon, as depicted in step 16 of FIG. 1. The rinsing and drying of substrate 20 should not remove significant amounts of Tiron or palladium from aluminum electrode 21.

Finally, step 18 of FIG. 1 is performed. A plurality of conductive bumps 22 and 23 are formed on aluminum electrode 21. In accordance with the present invention, conductive bumps 22 and 23 comprise a conductive polymer paste of epoxy or, preferably, cyanate ester. The cyanate ester is filled with metallic particles, preferably silver flakes, to provide conductivity through the cured cyanate ester composite. Conductive bumps 22 and 23 can alternatively comprise solder or other conventional interconnect materials. While FIG. 2 illustrates a plurality of conductive bumps 22 and 23 on a single aluminum electrode 21, it is understood that a single conductive bump can also be formed on a single aluminum electrode. The formation process of conductive interconnects 22 and 23 comprises dispensing, stenciling, screen printing, or other conventional formation processes known in the art, and as also known in the art, conductive bump 22 and 23 are cured in a thermal treatment after formation.

Electrical contact between the silver flakes of conductive bumps 22 and 23 and aluminum electrode 21 is enhanced by the layer of palladium over aluminum electrode 21 and is also enhanced by the Tiron which inhibits aluminum oxide formation. The conductive layer of palladium reduces the contact resistance of flip chip structure 24 by decreasing the interfacial resistance between aluminum electrode 21 and conductive layer or conductive bumps 22 and 23. In addition to preventing the growth of aluminum oxide on aluminum electrode 21, the Tiron layer is also believed to further catalyze the shrinkage of the cyanate ester resin of conductive bumps 22 and 23 which results in further compression of the conductive particles to each other and to the aluminum surface which additionally improves electrical contact and reduces contact resistance between conductive bumps 22 and 23 and underlying aluminum electrode 21 and the conductive layer of palladium. Consequently, contact resistances in the range of 30 mΩ and as low as 3 mΩ per 100 µm diameter bond pad have been measured on interconnect structures fabricated by processes described above in accordance with the present invention.

This invention requires up only to approximately one third of the process steps and up to approximately one eighth of the cycle time required for alternative methods of interconnect formation on aluminum electrodes including electroless nickel with immersion gold depositions, and vacuum deposition processes. A significant time saving, complexity reducing, and cost saving difference from the alternative methods is the elimination of photolithography and etch processing steps necessary for patterning vacuum deposited metallizations, or the multitude of wet chemical operations for the conventional electroless deposition processes.

Therefore, in accordance with the present invention, it is apparent there has been provided an improved method of forming an electrically conductive polymer interconnect on an aluminum electrode which overcomes the disadvantages of the prior art. The present invention eliminates the use of more expensive gold or solder based interconnect technologies and is very cost effective. The subject invention also reduces the cycle time of the interconnect process, reduces corrosion, is lead-free and reduces contact resistance of the flip chip structure.

We claim:

1. A method of forming an electrically conductive polymer bump over an aluminum electrode, the method comprising:

providing a substrate;

disposing an aluminum layer over the substrate;

patterning the aluminum layer to form the aluminum electrode;

etching the aluminum electrode with an etchant to remove aluminum oxide from the aluminum electrode;

immersing the substrate in aqueous solutions of a chelate and metallic ions;

rinsing the substrate;

drying the substrate;

forming the electrically conductive polymer bump over the aluminum electrode; and curing the electrically conductive polymer bump.

2. The method according to claim 1, further comprising selecting the substrate from the group consisting of silicon, silicon germanium, gallium arsenide, indium phosphide, printed wiring boards, organic substrates, and inorganic substrates.

3. The method according to claim 1, further comprising providing less than five percent copper and less than three percent silicon in the aluminum layer.

4. The method according to claim 1, further selecting the etchant from the group consisting of alkali metal hydroxides, phosphoric acid, and other non-oxidizing acids having a pKa less than five.

5. The method according to claim 1, wherein the immersing step further comprises first immersing the substrate in a first aqueous solution of Tiron and then immersing the substrate in a second aqueous solution of palladium salts.

6. The method according to claim 1, wherein the immersing step further comprises first immersing the substrate in a first aqueous solution of palladium and then immersing the substrate in a second aqueous solution of Tiron.

7. The method according to claim 1, wherein the immersing step comprises immersing the substrate in aqueous solutions which are buffered.

8. The method according to claim 1, further comprising selecting the electrically conductive polymer bump from the group consisting of epoxy and cyanate ester.

9. A method of forming a conductive bump over an aluminum pad, the method comprising:

providing a substrate having the aluminum pad;

removing aluminum oxide from the aluminum pad;

exposing the aluminum pad to an aqueous solution having metallic ions and to an aqueous solution having a chemical with a formation constant with aluminum greater than formation constant of aluminum with hydroxide;

rinsing the substrate;

drying the substrate; and forming the conductive bump over the aluminum pad.

10. The method according to claim 9, further providing an aluminum pad having less than five percent copper and less than three percent silicon for the aluminum pad.

11. The method according to claim 9, further providing an additional aqueous solution to remove the aluminum oxide and further selecting the additional aqueous solution from the group consisting of alkali metal hydroxides, phosphoric acid, and other non-oxidizing acids having a pKa less than five.

12. The method according to claim 9, further comprising selecting the metallic ions from the group consisting of palladium, silver, copper, zinc, gold, tin, iridium, and other metallic ions with reduction potentials greater than approximately $-0.77$ volts.

13. The method according to claim 9, further providing an acidic aqueous solution for the aqueous solution having metallic ions.

14. The method according to claim 9, further comprising selecting the chemical from the group consisting of Tiron, 5-sulfosalicylic acid, pyrocatechol-3,5 sulfonic acid, salicylic acid, and other complexing agents having a log $K_1$ with aluminum greater 9.27.

15. The method according to claim 9, further providing a chelation agent in an alkaline condition for the aqueous solution having the chemical.

16. The method according to claim 9, wherein the forming step further comprises dispensing the conductive bump over the aluminum pad.

17. The method according to claim 9, wherein the forming step further comprises using cyanate ester filled with metallic particles for the conductive bump.

18. The method according to claim 9, wherein the forming step further comprises using epoxy for the conductive bump.

19. A method of forming a conductive layer over an aluminum layer, the method comprising:

providing a substrate having the aluminum layer;

etching aluminum oxide off of the aluminum layer;

dipping the aluminum layer into an acidic aqueous solution of palladium salts;

rinsing the substrate with deionized water;

blow drying the substrate with an inert gas; and providing the conductive layer over the aluminum layer.

20. The method according to claim 19, further providing phosphoric acid for the etching step and further comprising dipping the aluminum layer into an alkaline aqueous Tiron solution prior to the rinsing step.

* * * * *